(12) United States Patent
Kim et al.

(10) Patent No.: US 7,397,305 B2
(45) Date of Patent: Jul. 8, 2008

(54) HIGH OUTPUT POWER AMPLIFIER WITH ADJUSTABLE VOLTAGE TRANSFORMATION RATIO OF TRANSFORMER

(75) Inventors: Younsuk Kim, Daejeon (KR); Songcheol Hong, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 169 days.

(21) Appl. No.: 11/354,058

(22) Filed: Feb. 15, 2006

(65) Prior Publication Data

US 2006/0186956 A1     Aug. 24, 2006

(30) Foreign Application Priority Data

Feb. 24, 2005     (KR) ...................... 10-2005-0015437

(51) Int. Cl.
*H03F 3/00* (2006.01)
*H03F 1/00* (2006.01)

(52) U.S. Cl. ...................................... 330/146; 330/195

(58) Field of Classification Search ................. 330/146, 330/165, 195
See application file for complete search history.

(56) References Cited

U.S. PATENT DOCUMENTS 5,003,271 A * 3/1991 Swanson ..................... 330/146
6,522,201 B1    2/2003 Hsiao et al.

OTHER PUBLICATIONS

I. Aoki et al.; "A Fully-Integrated 1.8-V, 2.8-W, 1.9-GHz, CMOS Power Amplifier"; *IEEE MTT-S Digest*; 2003; pp. 199-202.

* cited by examiner

*Primary Examiner*—Khanh V Nguyen
(74) *Attorney, Agent, or Firm*—Oliff & Berridge, PLC

(57) ABSTRACT

A high output power amplifier with change of voltage transformation ratio of a transformer is disclosed. The high output power amplifier using a transformer installed to output leads thereof, which can increase dynamic range and efficiency thereof as voltage transformation ratio of the transformer is adjusted and load resistance is adjusted so as not to generate signal distortion phenomenon and not to decrease its efficiency.

2 Claims, 6 Drawing Sheets

(a)

(b)

(a)

Vout = 4*Vin+
voltage transformation ratio : 4:1
(50ohm -> 3.125ohm)

(b)

Vout = 2*Vin+
voltage transformation ratio : 2:1
(50ohm -> 12.5ohm)

HIGH OUTPUT POWER AMPLIFIER WITH ADJUSTABLE VOLTAGE TRANSFORMATION RATIO OF TRANSFORMER

BACKGROUND OF THE INVENTION

1. Field of the Invention

The present invention relates to a power amplifier, and more particularly to a high output power amplifier with adjustable voltage transformation ratio of a transformer which is installed to output leads thereof, which can increase dynamic range and efficiency thereof as a voltage transformation ratio of the transformer is adjusted and load resistance is adjusted so as not to generate signal distortion phenomenon and not to decrease its efficiency.

2. Description of the Related Art

Generally, saturation power showing output power $P_{out}$ of an amplifier can be expressed as following equation (1).

$$P_{out} = V_{suppy}^2 / R_{load} \qquad (1)$$

Here, $P_{out}$, $V_{suppy}$ and $R_{load}$ denote output power, source voltage and load resistance.

As shown in equation (1), when $V_{suppy}$ is adjusted, the output power $P_{out}$ is controlled.

With reference to FIG. 1 of a circuit diagram illustrating a prior art high output power amplifier, a source voltage controller 113 performs conversion of input voltage 112 to adjust source voltage 114 inputted to the amplifier 115, using a DC-DC converter or a low dropout voltage regulator (LDO), for example.

However, since the source voltage controller 113 has limited control of the range of output power $P_{out}$ 118, as shown in FIG. 1, as the load resistance $R_{load}$ 119 is changed, the dynamic range of the output power $P_{out}$ 118 can be more highly controlled.

Therefore, as load resistance 116 with respect to output of the amplifier 115 is adjusted using a variable load unit 117, the dynamic range and efficiency of the high output power amplifier of the prior art can be increased.

FIG. 2a to FIG. 2c are graphs describing changes of efficiency of a prior art high output power amplifier as load resistance is changed.

More specifically, FIG. 2a is a graph illustrating a voltage, current, and consumption power (a rectangular area which is indicated by slant lines) at the maximum output. FIG. 2b is a graph in a state wherein the efficiency of the high output power amplifier is decreased, compared at the maximum output power, because the consumption power is not reduced, when the output power is decreased to a half thereof, if the load resistance is not change. FIG. 2b is a graph in a state wherein the efficiency of the high output power amplifier is maintained, because the consumption power (a rectangular area which is indicated by slant lines) is decreased, when the load resistance is doubled, if the output power is reduced to a half thereof.

Therefore, with reference to FIG. 3a and FIG. 3b showing circuits for changing load resistance of a prior art high output power amplifier, a method for changing the load resistance of the amplifier is described as follows.

As shown in FIG. 3a, the load resistance is changed using varactor diodes 127 and 130. Also, the load resistance is changed by switching transistors 134 and 135, as shown in FIG. 3b.

Here, the method using the varactor diodes 127 and 130 controls the load resistance such that, when voltage of the varactor diodes 127 and 130 is varied through control terminals 128 and 31, capacitance of the varactor diodes 127 and 130 is changed.

However, such a method has a disadvantage in that output voltage is clamped by turn-on voltage (approximately 0.7V) of the varactor diodes 127 and 130 and thus output power waveform is distorted.

In FIG. 3a, reference number 120 denotes a high output power transistor, reference number 121 denotes an input lead, reference numbers 122, 126, and 129 denote inductors, reference number 123 denotes a voltage source, reference numbers 124 and 125 denote capacitors, reference number 132 denotes an output lead, and reference number 133 denotes a load resister.

Also, as shown in FIG. 3b, the load resistance can be changed as switching transistors 134 and 135 are turned on/off.

However, the method using the switching transistors has drawbacks in that efficiency is relatively small since size of the switching transistor is relatively large and turn-on resistance of the switching transistors exsists.

SUMMARY OF THE INVENTION

Therefore, the present invention has been made in view of the above problems, and it is an object of the present invention to provide a high output power amplifier with adjustable voltage transformation ratio of a transformer which is installed to output leads thereof, which can increase dynamic range and efficiency thereof as a voltage transformation ratio of the transformer is adjusted and load resistance is adjusted so as not to generate signal distortion phenomenon and not to decrease its efficiency.

In accordance with the present invention, the above and other objects can be accomplished by the provision of a high output power amplifier with change of voltage transformation ratio of a transformer comprising: amplifiers which are formed in pairs to correspond to power transistors, such that power transistors receive differential input signals, respectively, to perform a differential operation; capacitors which are located between output leads of the power transistors; and a transformer whose primary nodes are connected to the output leads of the amplifiers, respectively, and whose secondary nodes are used as output leads.

Preferably, each of the power transistors of the amplifier may receive source voltage through a drain lead, via an inductor.

Preferably, each of the capacitors may have a relatively large capacitance such that the amplifier can be operated as Class E.

As such, the high output power amplifier according to the present invention can increase its dynamic range and efficiency as a voltage transformation ratio of the transformer is adjusted on the basis of on/off operation of a power transistor thereof, and thus load resistance is adjusted not to generate signal distortion phenomenon.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings.

Figure 1:
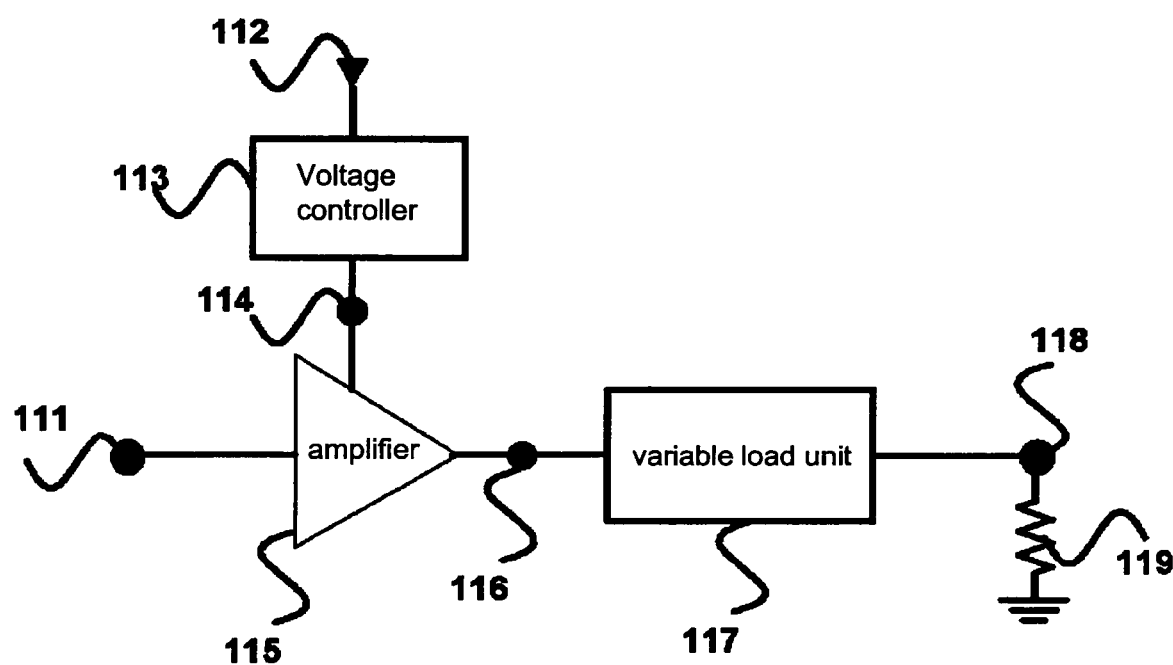
FIG. 1 is a circuit diagram illustrating a prior art high output power amplifier.
Figure 2:
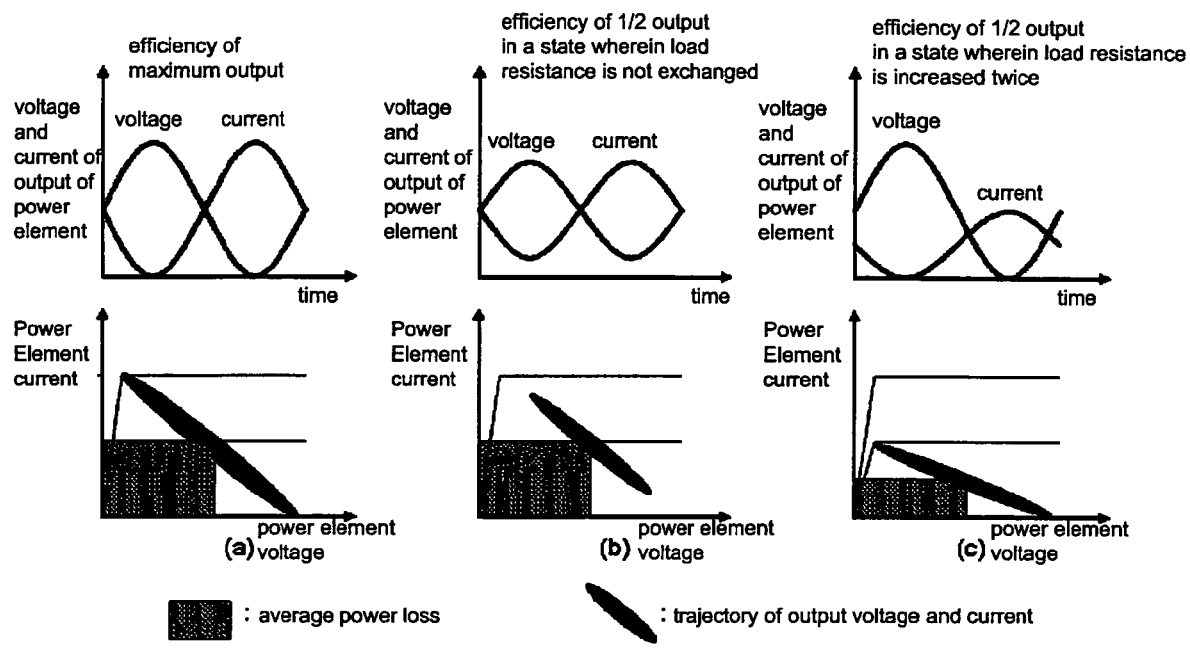
FIG. 2a to FIG. 2c are graphs describing changes of efficiency of a prior art high output power amplifier as load resistance is changed.
Figure 3:
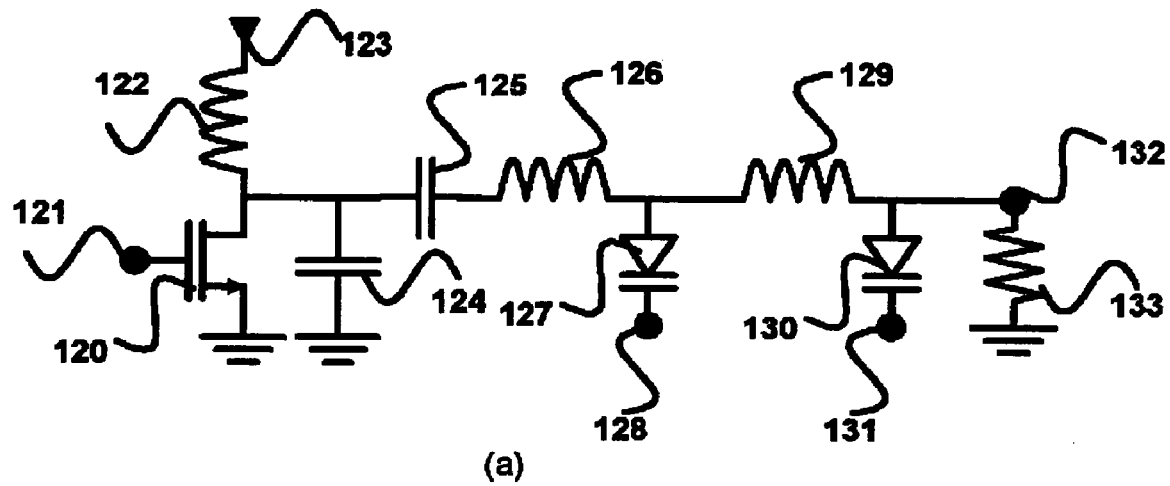
FIG. 3a and FIG. 3b are circuits for changing load resistance of a prior art high output power amplifier.
Figure 3:
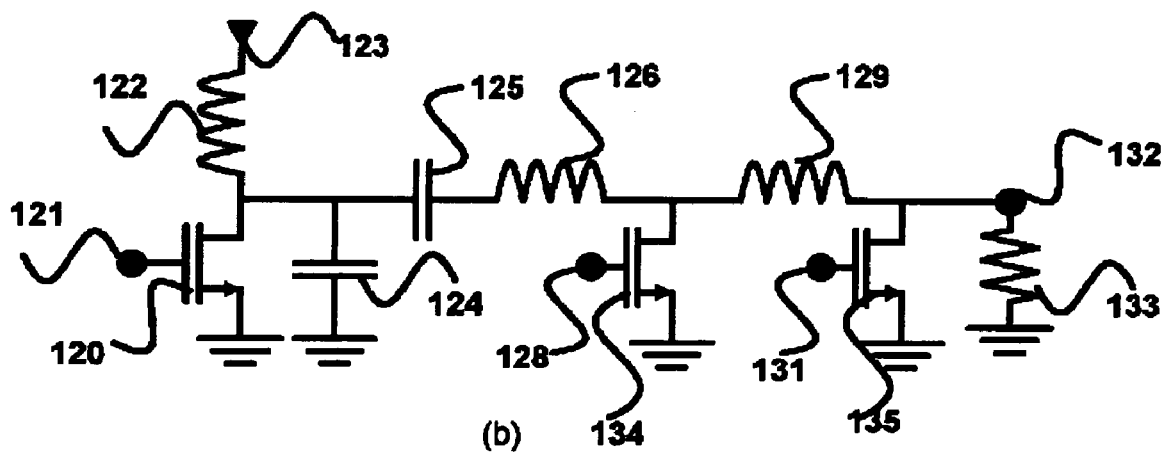
Figure 4:
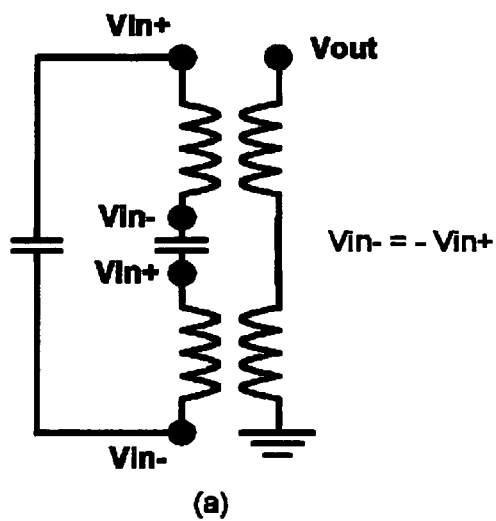
FIG. 4a and FIG. 4b are circuit diagrams describing a high output power amplifier with change of voltage transformation ratio of a transformer according to the present invention.
Figure 4:
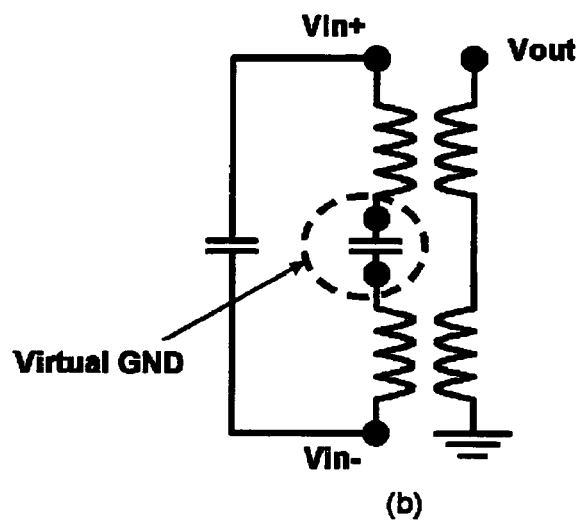

FIG. 4a and FIG. 4b are circuit diagrams describing a high output power amplifier with change of voltage transformation ratio of a transformer according to the present invention.

As shown in FIG. 4a, two pairs of input voltages, or four voltages, are applied to the amplifier. When voltage transformation ratio of one transformer is 1:1, the output voltage of the transformer is summation of four input voltages. Therefore, the voltage transformation ratio is substantially 4:1.

On the other hand, as shown in FIG. 4b, when two of four input voltages are not applied to the transformer, the leads to which two voltages are not applied are connected to virtual ground via a capacitor with a relatively large capacitance. Such a capacitor is usually used in a class E operation which is a type of operation of a high output power amplifier, in which the voltage transformation ratio is 2:1.

Namely, based on such a mentioned-construction, when all four input voltages are applied to the transformer, the voltage transformation ratio is 4:1. Also, when two input voltages are applied to the transformer, the voltage transformation ratio is 2:1.

Figure 5:
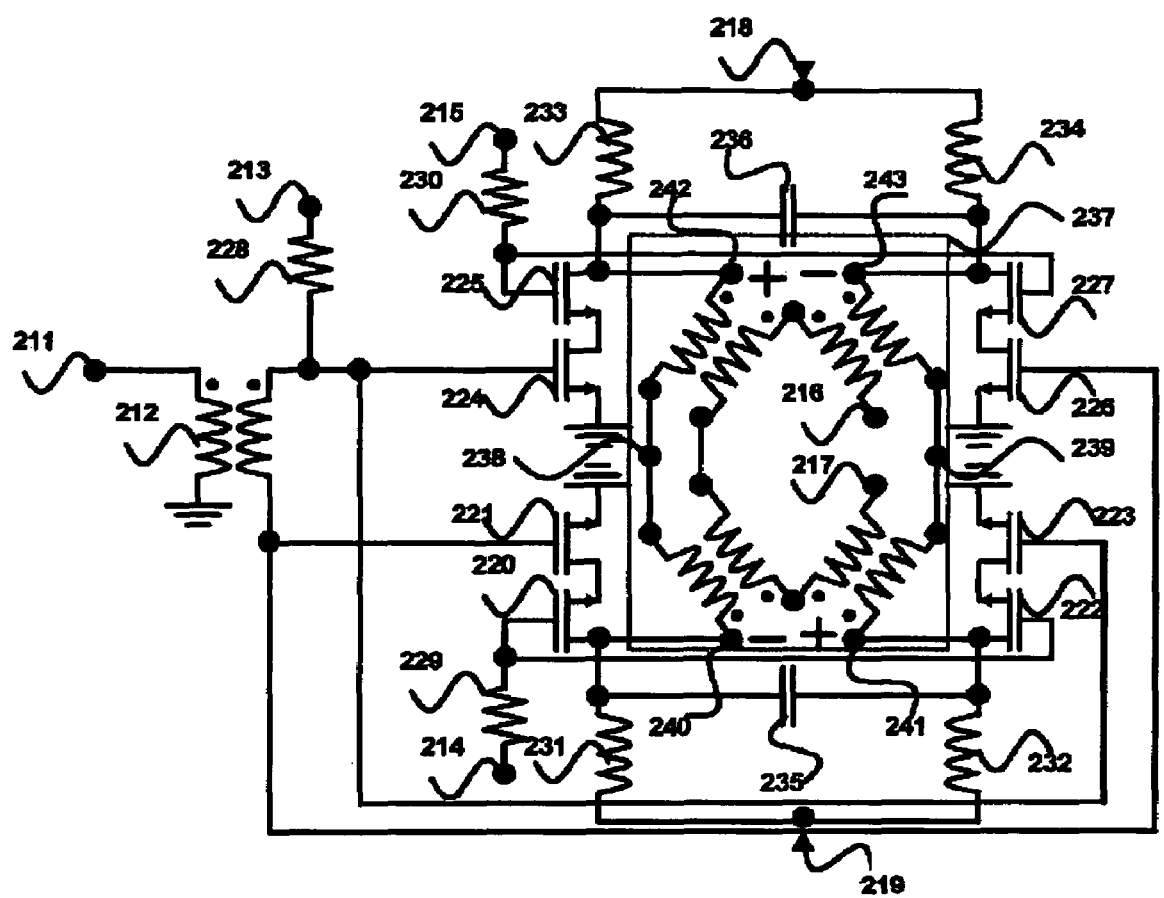
FIG. 5 is a circuit illustrating a high output power amplifier with change of voltage transformation ratio of a transformer according to the present invention.

FIG. 5 is a circuit illustrating a high output power amplifier with change of voltage transformation ratio of a transformer according to the present invention.

As shown in the drawing, the high output power amplifier includes amplifiers which are formed in pairs to correspond to power transistors 220~227 having a cascode structure, such that power transistors receive differential input signals, respectively, to perform a differential operation; capacitors 235 and 236 which are located between output leads 240~243 of the power transistors 220~227; and a transformer whose primary nodes are connected to the output leads 240~243 of the amplifiers, respectively, and whose secondary nodes are used as output leads 216 and 217.

Here, each of the capacitors 235 and 236 has a relatively large capacitance such that the amplifier can be operated as Class E.

Also, the power transistors 220, 222, 225, and 227 of the amplifier, input source voltages 218 and 219 through their drain leads via inductors 231~234 which function as radio frequency (RF) choke.

The high output power amplifier as configured above transforms a signal inputted to an input lead 211 into a differential signal through an input transformer 212. The transformed signal is applied to CMOS power transistors 220~227 of four cascode structures. The respective power transistors 220~227 receives bias voltages 213~215 through resistors 228~130.

Also, the capacitors 235 and 236 are correspondingly located between the power transistors 220~227 of cascode structures such that the high output power amplifier can be operated as Class E.

The source voltages 218 and 219 are inputted to the drain leads of the respective power transistors 220, 222, 225 and 227 through the inductors 231~234 which functions as radio frequency (RF) choke.

Voltages generated in the respective power transistors 220~227 are boosted four times by the transformer 237 and then outputted through the output leads 216 and 217. Here, the output signals can be outputted as differential signals or as a single ended signal as one end of the transformer is grounded.

Therefore, in order to vary a voltage transformation ratio of the transformer 237, one of gate bias input leads 214 and 215 of the power transistors 220~227 is grounded such that two cascode power transistors can be turned off. Although the power transistors are turned off, since the capacitors 235 and 236 are connected thereto, the drains of the turned-off power transistors are connected to the virtual ground. Therefore, when all power transistors are turned off, since the primary connection nodes 238 and 239 of the transformer 237 serially connected thereto are connected to the virtual ground, the voltage transformation is 4:1. On the other hand, when two power transistors are turned on, since output leads 240 and 241 at one side of the amplifier or output leads 242 and 243 at the other side of the amplifier are connected to the virtual ground, the voltage transformation is 2:1.

As such, when the voltage transformation ratio is changed, load resistance with respect to the drain output of the cascode transistors 220~227 is also changed. Therefore, the dynamic area and efficiency of the amplifier can be enhanced.

Figure 6:
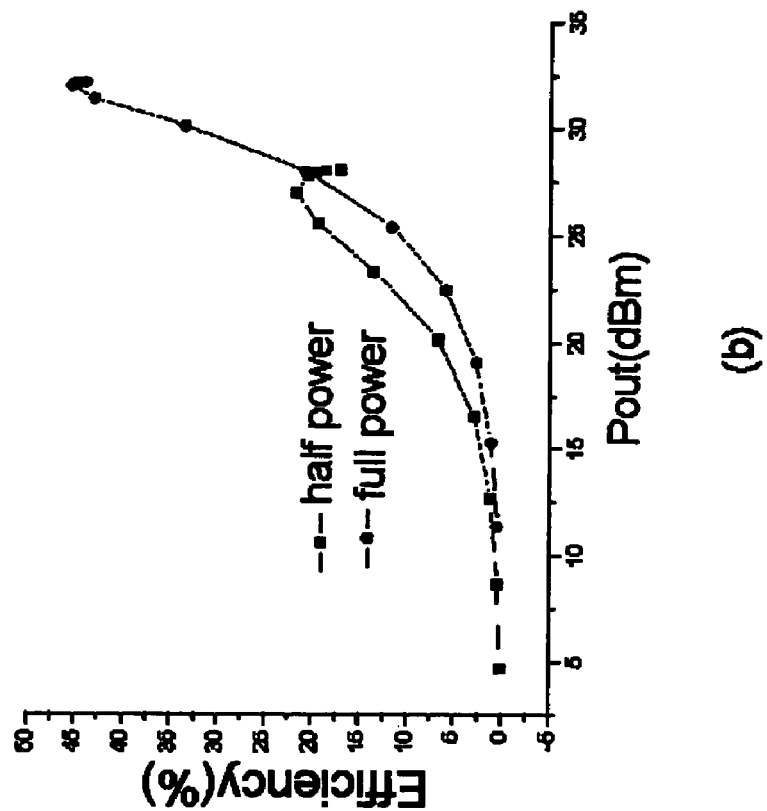
FIG. 6a and FIG. 6b are graphs of the simulation result of a high output power amplifier with change of voltage transformation ratio of a transformer according to the present invention.
Figure 6:
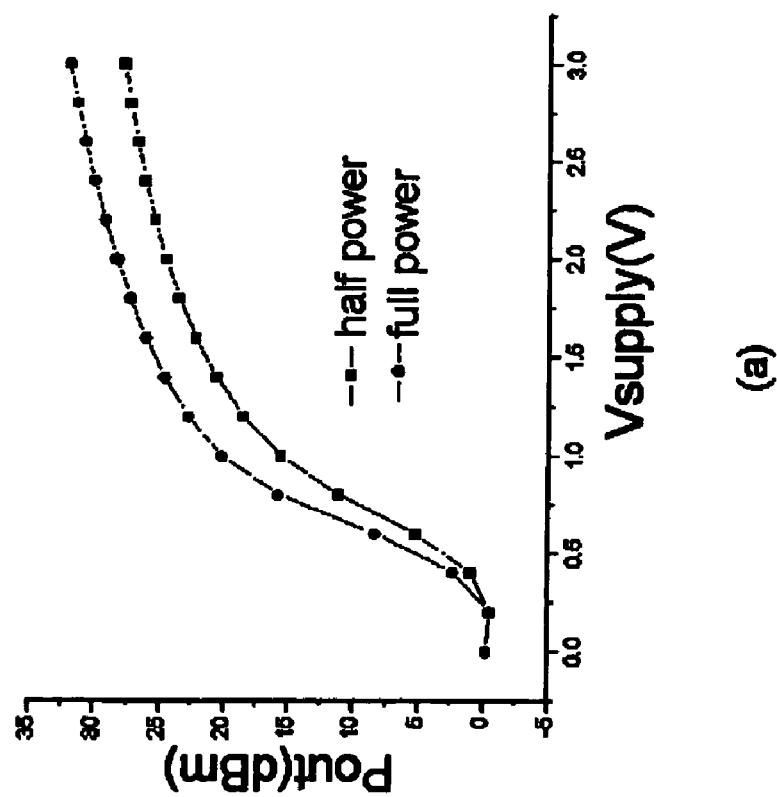

FIG. 6a and FIG. 6b illustrate graphs of the simulation result of a high output power amplifier with change of voltage transformation ratio of a transformer according to the present invention. As shown in FIG. 6a, the dynamic area of the high output power amplifier can be enhanced by 5 dB. Also, as shown in FIG. 6b, the efficiency of the amplifier at a half power is enhanced approximately 100%. Namely, it is increased by 100%, from 10% to 20%.

As apparent from the above description, the present invention provides a high output power amplifier with change of voltage transformation ratio of a transformer which is used its output leads, which can increase its dynamic range and efficiency as a voltage transformation ratio of the transformer is adjusted and load resistance is adjusted so as not to generate signal distortion phenomenon and not to decrease its efficiency.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A high output power amplifier with change of voltage transformation ratio of a transformer comprising:

amplifiers which are formed in pairs to correspond to power transistors, such that power transistors receive differential input signals, respectively, to perform a differential operation, wherein each of the power transistors of the amplifier receives source voltage through a drain lead, via an inductor;

capacitors which are located between output leads of the power transistors; and a transformer whose primary nodes are connected to the output leads of the amplifiers, respectively, and whose secondary nodes are used as output leads.

2. The high output power amplifier as set forth in claim 1, wherein each of the capacitors has a relatively large capacitance such that the amplifier can be operated as Class E.

* * * * *